United States Patent
MacDougall

(10) Patent No.: US 7,918,668 B1
(45) Date of Patent: Apr. 5, 2011

(54) SOCKET CONNECTOR ASSEMBLY WITH CONDUCTIVE POSTS

(75) Inventor: Alan R. MacDougall, Beavertown, OR (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/710,102

(22) Filed: Feb. 22, 2010

(51) Int. Cl.
*H01R 12/00* (2006.01)

(52) U.S. Cl. ......................................................... 439/66

(58) Field of Classification Search .............. 439/70–71, 439/66, 91
See application file for complete search history.

(56) References Cited

U.S. PATENT DOCUMENTS

| 5,380,210 | A | | 1/1995 | Grabbe et al. |
|---|---|---|---|---|
| 5,538,433 | A | * | 7/1996 | Arisaka ............................ 439/70 |
| 7,371,073 | B2 | | 5/2008 | Williams |
| 7,479,015 | B2 | | 1/2009 | Ruttan et al. |
| 2006/0258184 | A1 | * | 11/2006 | Alger et al. ....................... 439/71 |
| 2007/0082515 | A1 | * | 4/2007 | Goodman ......................... 439/70 |
| 2008/0207015 | A1 | | 8/2008 | Sueyoshi |

* cited by examiner

*Primary Examiner* — Briggitte R Hammond
*Assistant Examiner* — Larisa Z Tsukerman

(57) ABSTRACT

A socket connector assembly includes a socket substrate, terminals, and conductive posts. The socket substrate has a mating side and an opposite mounting side with holes extending through the socket substrate. The terminals are disposed above the mating side of the socket substrate and are configured to engage conductive pads of a mating substrate of an electronic package. The conductive posts are disposed in the holes and are elongated between upper and lower ends. The upper ends are electrically coupled with the terminals and the lower ends are configured to be electrically joined with a circuit board. The posts electrically couple the electronic package with the circuit board by providing conductive pathways through the socket substrate between the mating side and the mounting side of the socket substrate.

20 Claims, 4 Drawing Sheets

SOCKET CONNECTOR ASSEMBLY WITH CONDUCTIVE POSTS

BACKGROUND OF THE INVENTION

The invention relates generally to surface mounted connectors, and more specifically, to a socket connector assembly that is mounted to a circuit board.

The ongoing trend toward smaller, lighter, and higher performance electrical components and higher density electrical circuits has led to the development of surface mount technology in the design of printed circuit boards and electronic packages. Surface mountable packaging allows for a separable connection of a package, such as a computer processor, to pads on the surface of the circuit board rather than by contacts or pins soldered in plated holes going through the circuit board. Surface mount technology may allow for an increased component density on a circuit board, thereby saving space on the circuit board.

One form of surface mount technology includes socket connectors. A socket connector may include a substrate with conductive terminals on one side of the connector and an array of conductive solder elements on the opposite side. The substrate includes vias that are plated with a conductive material to provide conductive pathways through the substrate. The terminals are joined with the vias on one side of the substrate and the solder elements are joined with the vias on the opposite side of the substrate. The terminals engage contacts on an electronic package, such as a processor, and the solder elements are affixed to conductive pads on a circuit board to electrically join the electronic package with the circuit board.

As the need for smaller, lighter, and higher performance electrical components and higher density electrical circuits increases, the need for smaller vias in the substrates of the socket connectors increases. For example, increasing the number of conductive vias through the substrate may increase the number of available terminals to engage contacts of the electronic package. More conductive vias may enable transfer of data at a faster rate.

But, increasing the number of vias in the substrate introduces problems. The size of the substrate may be limited. Increasing the number of vias may require increasing the density of the vias by reducing the via pitch distance and reducing the diameters of the via holes. Decreasing the hole diameters increases the aspect ratio of the holes. If the aspect ratio of the holes becomes too large, it can become difficult to reliably plate the walls of the holes in the substrate. For example, holes that are too narrow throughout the thickness of the substrate may not allow for a conductive plating material to coat or plate the wall of the hole along the entire thickness of the substrate. If the conductive plating does not extend all the way through the thickness of the substrate, then the vias may not electrically couple the terminals with the solder elements on opposite sides of the substrate. Additionally, decreasing the pitch distance between the vias reduces the surface areas of the via land diameters that are used to connect terminals to the vias. If the land diameters become too small, the vias may not have enough surface area for terminal connection.

A need exists for a socket connector assembly that provides a greater density of conductive pathways through the thickness of a substrate in the assembly.

BRIEF DESCRIPTION OF THE INVENTION

In one embodiment, a socket connector assembly is provided. The socket connector assembly includes a socket substrate, terminals, and conductive posts. The socket substrate has a mating side and an opposite mounting side with holes extending through the socket substrate. The terminals are disposed above the mating side of the socket substrate and are configured to engage conductive pads of a mating substrate of an electronic package. The conductive posts are disposed in the holes and are elongated between upper and lower ends. The upper ends are electrically coupled with the terminals and the lower ends are configured to be electrically joined with a circuit board. The posts electrically couple the electronic package with the circuit board by providing conductive pathways through the socket substrate between the mating side and the mounting side of the socket substrate.

In another embodiment, another socket connector assembly is provided. The socket connector assembly includes a socket substrate, terminals, and posts. The socket substrate has a mating side and an opposite mounting side with holes extending through the socket substrate. The terminals are disposed above the mating side of the socket substrate and are configured to engage conductive pads of a mating substrate of an electronic package. The posts are loaded into the holes and include solid bodies of conductive material that extend between upper ends and opposite lower ends. The upper ends are electrically joined with the terminals and the lower ends are configured to be electrically joined with a circuit board. The posts provide conductive pathways extending through the socket substrate from the terminals to the mounting side of the socket substrate.

DETAILED DESCRIPTION OF THE INVENTION

Figure 1:
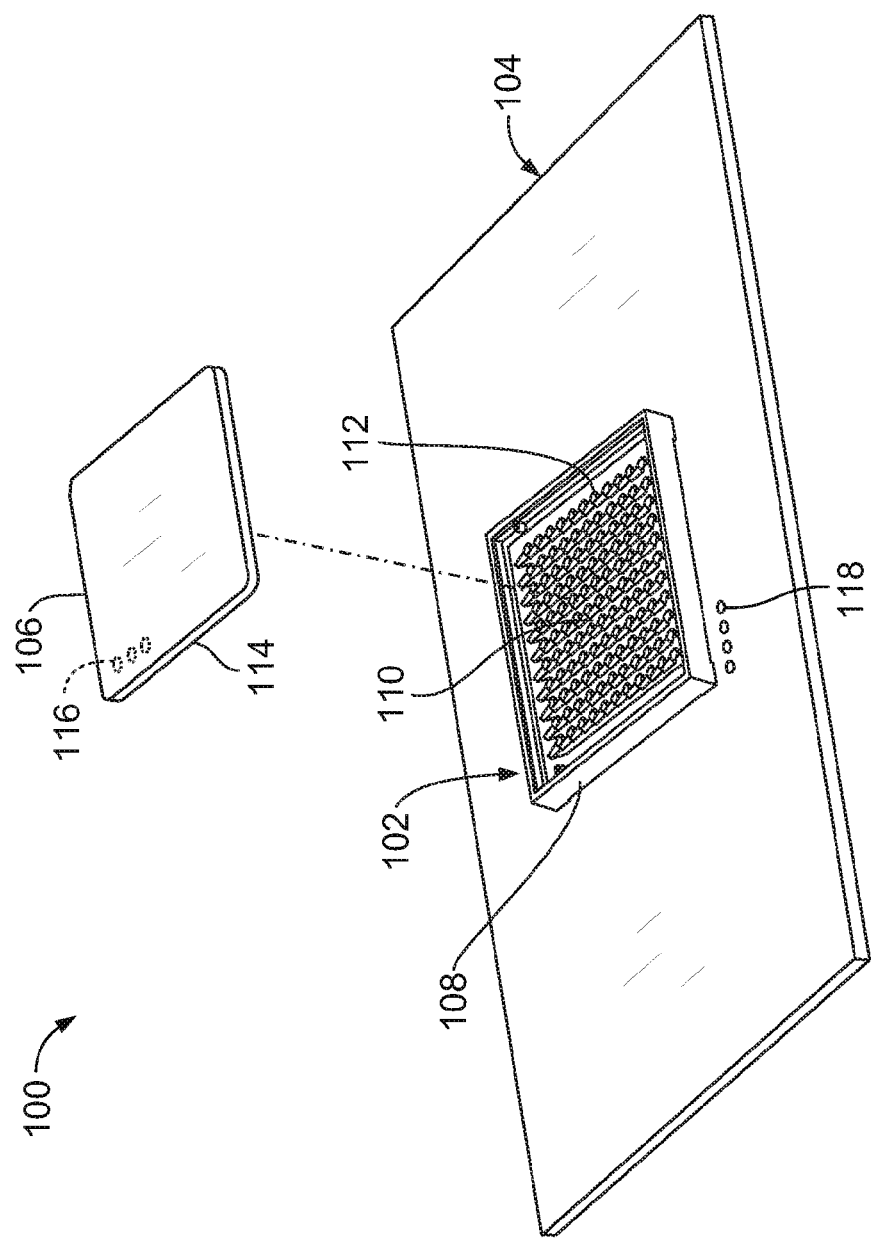
FIG. 1 illustrates an electronic system including a socket connector assembly formed in accordance with one embodiment of the present disclosure.

FIG. 1 is an exploded view of an electronic system 100 including a socket connector assembly 102 formed in accordance with one embodiment of the present disclosure. The socket connector assembly 102 is mounted on a circuit board 104. A mating electronic package 106 is loaded onto the socket connector assembly 102 to electrically couple the electronic package 106 with the socket connector assembly 102. When loaded onto the socket connector assembly 102, the electronic package 106 is electrically connected to the circuit board 104 by way of the socket connector assembly 102. The electronic package 106 may be a chip or module such as, but not limited to, a central processing unit (CPU), microprocessor, or an application specific integrated circuit (ASIC), or the like.

The socket connector assembly 102 includes a dielectric housing 108 that is mounted to the circuit board 104. The housing 108 holds a socket substrate 110 that is formed in accordance with one embodiment of the present disclosure. By way of example only, the substrate 110 may be a dielectric supporting layer formed of FR-4 or CEM2. The socket connector assembly 102 includes several terminals 112 disposed above the substrate 110. By "above," it is meant that the terminals 112 are disposed proximate to a mating side 402 (shown in FIG. 4) of the substrate 110 as the substrate 110 is shown in FIG. 1. As described below, the terminals 112 are conductive bodies that are electrically joined with conductive posts 500 (shown in FIG. 5) held in the substrate 110. The posts 500 may be electrically coupled with the circuit board 104 by solder balls. For example, the circuit board 104 may have conductive pads 118 that are electrically joined with the posts 500 by conductive solder.

The electronic package 106 has a mating substrate 114 that engages the socket connector assembly 102. For example, the electronic package 106 may include conductive pads 116 on the mating substrate 114 that engage the terminals 112 of the socket connector assembly 102 when the electronic package 106 is loaded into the housing 108 of the socket connector assembly 102. The electronic package 106 is electrically joined with the circuit board 104 by the socket connector assembly 102 when the mating 114 engages the terminals 112.

Figure 2:
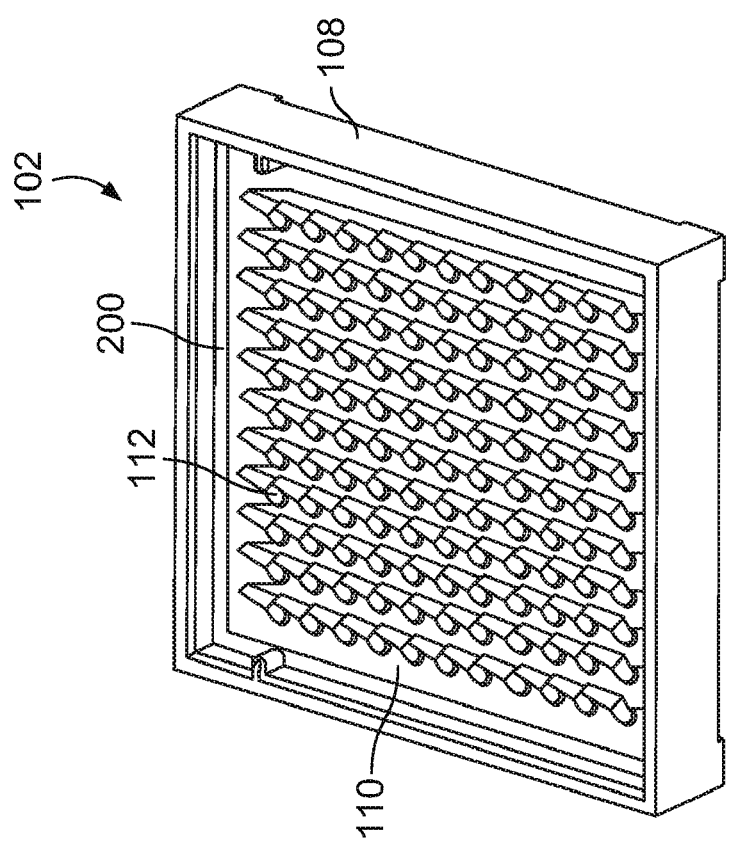
FIG. 2 is a perspective view of the socket connector assembly shown in FIG. 1 in accordance with one embodiment.

FIG. 2 is a perspective view of the socket connector assembly 102 in accordance with one embodiment. The terminals 112 of the socket connector assembly 102 may be elongated conductive bodies that flex or are biased downward toward the substrate 110 when the electronic package 106 (shown in FIG. 1) engages the terminals 112. The terminals 112 may be spring fingers that are joined to the posts 500 (shown in FIG. 5) in the substrate 110 at one end in a manner similar to cantilevered beams. The terminals 112 may be electrically isolated from one another. For example, the terminals 112 may be spaced apart such that no two or more terminals 112 contact each other when the terminals 112 are biased by the electronic package 106.

The housing 108 encircles the substrate 110 in the illustrated embodiment. The housing 108 includes an internal ridge 200 that encircles the terminals 112 above the substrate 110. The ridge 200 provides a surface that limits how far the electronic package 106 (shown in FIG. 1) can be loaded into the socket connector assembly 102. For example, the electronic package 106 may engage the ridge 200 when the electronic package 106 is lowered into the housing 108. Limiting the distance that the electronic package 106 can be loaded into the socket connector assembly 102 toward the substrate 110 may prevent the terminals 112 from being damaged by the electronic package 106.

Figure 3:
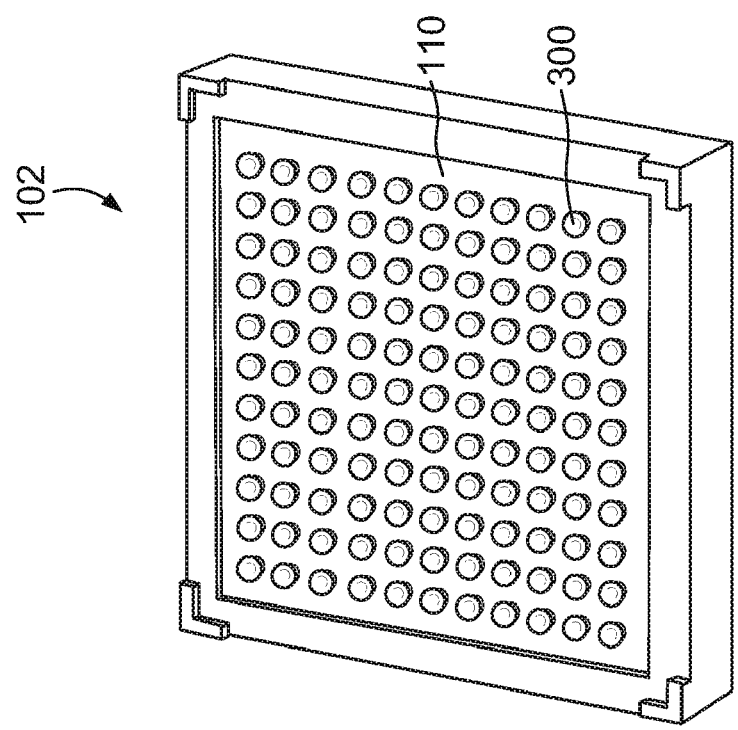
FIG. 3 is another perspective view of the socket connector assembly shown in FIG. 1 in accordance with one embodiment.

FIG. 3 is another perspective view of the socket connector assembly 102 in accordance with one embodiment. The view of the socket connector assembly 102 shown in FIG. 2 may be referred to as a top view of the socket connector assembly 102 and the view shown in FIG. 3 may be referred to as an opposite bottom view. As shown in FIG. 3, the socket connector assembly 102 includes conductive solder 300 on the substrate 110. The solder 300 may be provided as solder balls in a Ball Grid Array (BGA). The solder 300 can be joined with the posts 500 (shown in FIG. 5) held in the substrate 110 to electrically join the posts 500 with the solder 300. The solder 300 may then be reflowed to be electrically coupled with the conductive pads 118 (shown in FIG. 1) on the circuit board 104 (shown in FIG. 1) to provide conductive pathways from the terminals 112 (shown in FIG. 1) to the circuit board 104. Alternatively, a different connection scheme may be used to electrically couple the posts 500 with the conductive pads 118 of the circuit board 104.

Figure 4:
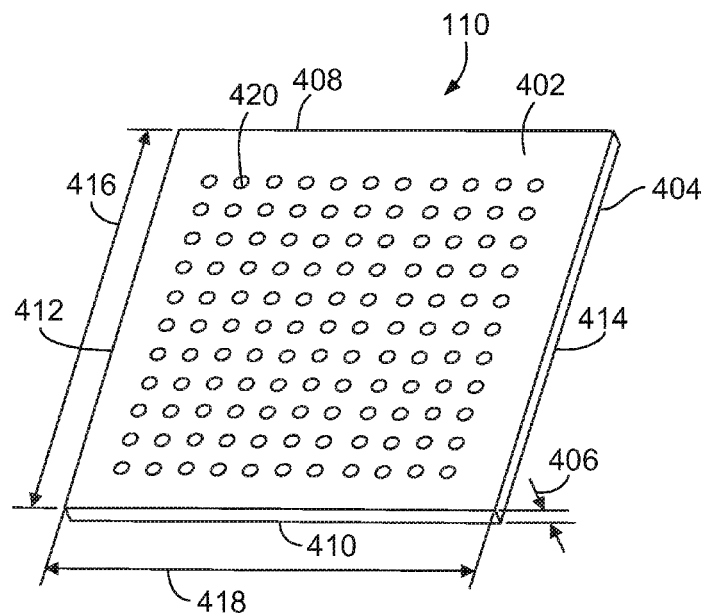
FIG. 4 is a perspective view of a socket substrate shown in FIG. 1 in accordance with one embodiment of the present disclosure.

FIG. 4 is a perspective view of the substrate 110 in accordance with one embodiment of the present disclosure. The substrate 110 may include or be formed from one or more dielectric layers. By way of example only, the substrate 110 may be formed from FR-4 or CEM2 layers. The substrate 110 extends between a mating side 402 and an opposite mounting side 404. The mating side 402 includes the terminals 112 (shown in FIG. 1) and the mounting side 404 is coupled to the circuit board 104.

The mating and mounting sides 402, 404 may be separated by a thickness dimension 406 of the substrate 110. In one embodiment, the thickness dimension 406 may be approximately 0.5 millimeters. Alternatively, the thickness dimension 406 may be a different distance.

The substrate 110 includes several edges 408, 410, 412, 414 that intersect one another. For example, the substrate 110 may extend between opposite edges 408, 410 of a first set of the edges 408, 410, 412, 414 and between opposite edges 412, 414 of a second set of the edges 408, 410, 412, 414. The edges 408, 410, 412, 414 define the outer boundaries of the substrate 110. In one embodiment, the substrate 110 has a surface area that is bounded by the edges 408, 410, 412, 414 of 1600 square millimeters or less. By way of example only, a first distance dimension 416 between the edges 408, 410 and a second distance dimension 418 between the edges 412, 414 are approximately 40 millimeters or less. For example, the first and second distance dimensions 416, 418 may be approximately 37.6 millimeters or less. Alternatively, different distances may be used for the first and/or second distance dimensions 416, 418.

The substrate 110 includes several holes 420 that extend through the substrate 110. For example, the holes 420 may be through holes that are punched or drilled through the thickness dimension 406 of the substrate 110. The holes 420 may not be plated with a conductive material.

The holes 420 may have inside diameter dimensions 800 (shown in FIG. 8) that are sufficiently small such that a relatively large number of holes 420 may be provided through the substrate 110. While the substrate 110 shown in FIG. 4 only includes 121 holes 420 for ease of illustration, the substrate 110 may include a much larger number of holes 420. By way of example only, the substrate 110 may include 1,500 to 2,000 holes 420. In another embodiment, the substrate 110 may include 2,000 to 3,000 holes 420. Alternatively, the substrate 110 may include 3,000 to 5,000 holes 420. Depending on the inside diameter dimensions 800 of the holes 420 and the first and second distance dimensions 416, 418 of the substrate 110, the substrate 110 may include more than 5,000 holes 420. The number of holes 420 provided in the substrate 110 may be referred to as the pin count of the socket connector assembly 102 (shown in FIG. 1) as the number of holes 420 may represent the number of conductive pathways extending through the substrate 110 from the mating side 402 to the mounting side 404 once the posts 500 (shown in FIG. 5) are loaded into the holes 420.

Figure 5:
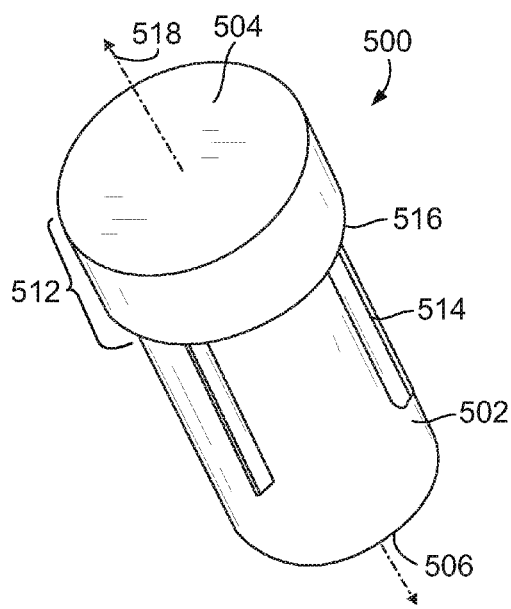
FIG. 5 is a perspective view of a post in accordance with one embodiment of the present disclosure.
Figure 6:
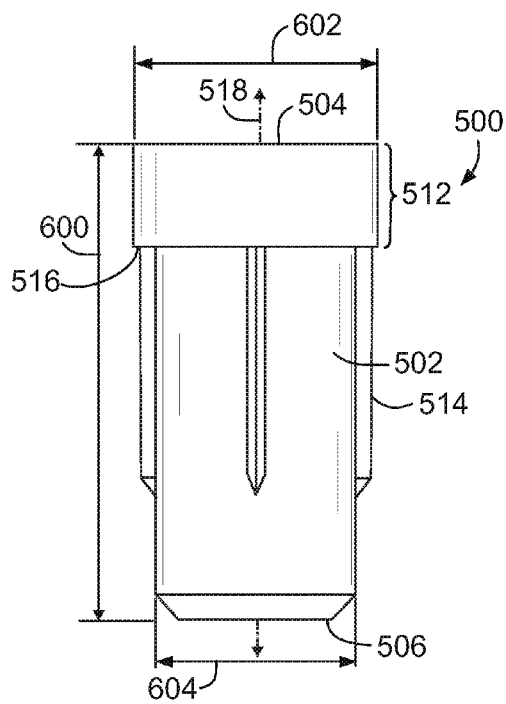
FIG. 6 is a plan view of the post shown in FIG. 5.

FIG. 5 is a perspective view of one of the posts 500 in accordance with one embodiment of the present disclosure. FIG. 6 is a plan view of the post 500 shown in FIG. 5. The post 500 has a solid conductive body 502 that has a cylindrical shape. In one embodiment, the body 502 is solid in that the body 502 does not include vias, gaps, openings, or other voids in the body 502. For example, the body 502 may be a copper alloy with a nickel plating about the exterior of the body 502. The body 502 may be cold formed to prevent or reduce gaps or voids in the body 502. In one embodiment, the body 502 may be a segment of a conductive wire.

The post 500 is elongated along a longitudinal axis 518 between an upper end 504 and an opposite lower end 506. As shown in FIG. 6, the upper end 504 may have a greater outer diameter dimension 602 than an outer diameter dimension 604 of the lower end 506. For example, the upper end 504 may include a head portion 512 that is larger than the remainder of the body 502. The outer diameter dimension 602 of the head portion 512 may be larger than an inside diameter dimension 800 (shown in FIG. 8) of the holes 420 (shown in FIG. 4) to restrict how far the post 500 is loaded into the hole 420. For example, the inside diameter of the holes 420 may be approximately 0.35 millimeters while the outer diameter dimension 602 of the head portion 512 is approximately 0.4 millimeters. The head portion 512 extends from the upper end 504 to a shoulder 516. The post 500 may be loaded into the hole 420 until the shoulder 516 engages the mating side 402 (shown in FIG. 4) of the substrate 110 (shown in FIG. 1).

In the illustrated embodiment, the post 500 includes radially protruding ribs 514 that are elongated along a length dimension 600 (shown in FIG. 6) of the post 500. For example, the ribs 514 may be elongated in the same direction as the body 502. The length dimension 600 extends from the upper end 504 to the lower end 506. The ribs 514 may engage the substrate 110 inside the hole 420 to provide an interference fit and secure the post 500 in the hole 420. Alternatively, one or both of the head portion 512 and the ribs 514 may not be provided.

Figure 7:
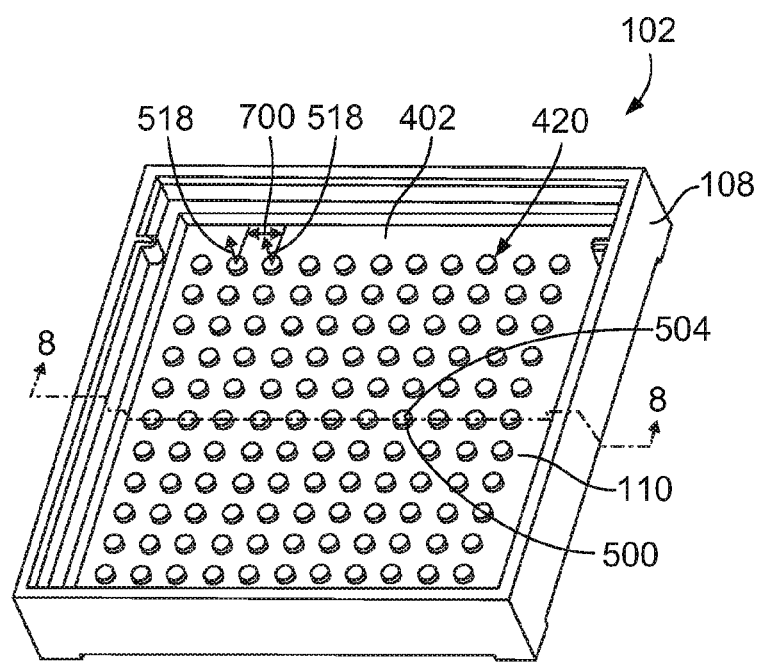
FIG. 7 is a perspective view of the socket connector assembly shown in FIG. 1 with terminals also shown in FIG. 1 removed in accordance with one embodiment.
Figure 8:
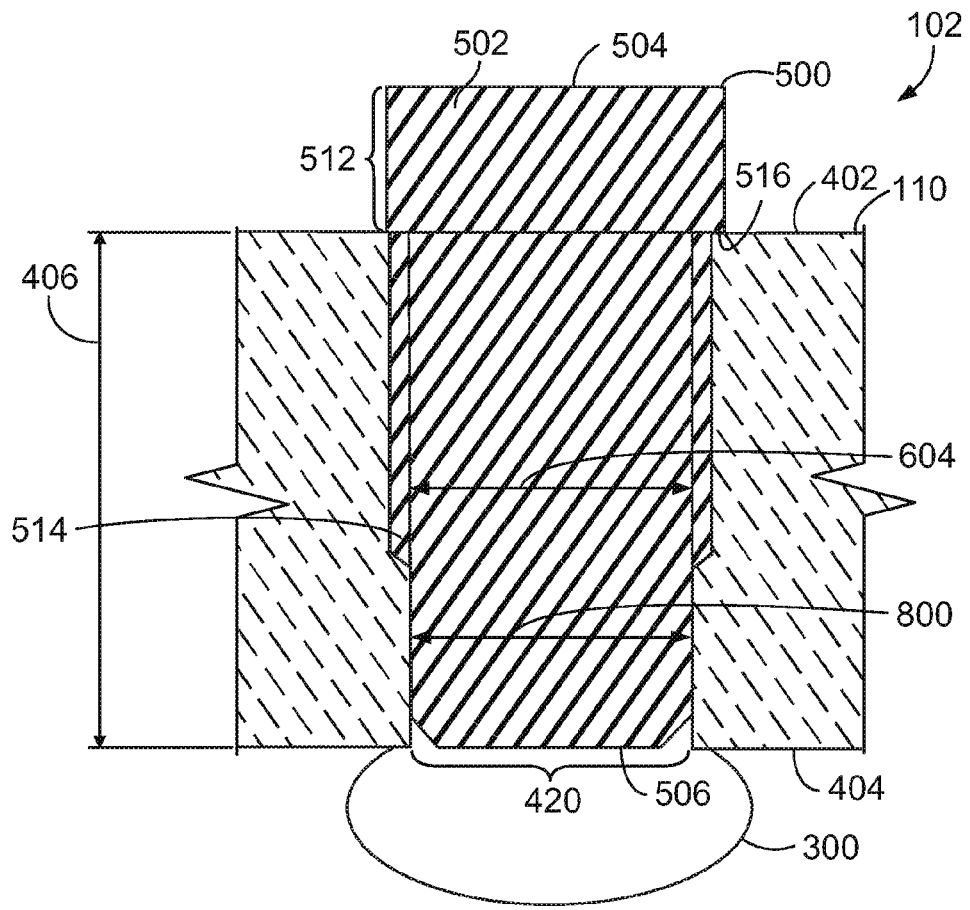
FIG. 8 is a cross-sectional view of a portion of the socket connector assembly shown in FIG. 7 along line 8-8 in FIG. 7.

FIG. 7 is a perspective view of the socket connector assembly 102 with the terminals 112 (shown in FIG. 1) removed in accordance with one embodiment. FIG. 8 is a cross-sectional view of a portion of the substrate 110 of the socket connector assembly 102 shown in FIG. 7 along line 8-8 in FIG. 7. In accordance with one embodiment, the socket connector assembly 102 may be assembled by first punching or drilling the holes 420 in the substrate 110, followed by insert molding the housing 108 around the substrate 110. The posts 500 may then be loaded into the holes 420. As described above, a relatively large number of holes 420 may be provided in the substrate 110 such that the pin count of the socket connector assembly 102 is relatively large. As the pin count of the socket connector assembly 102 increases, a pitch dimension 700 of the posts 500 in the holes 420 may decrease. The pitch dimension 700 may be the distance between common points of adjacent posts 500. For example, as shown in FIG. 7, the pitch dimension 700 may be the distance between the longitudinal axes 518 of adjacent posts 500. In one embodiment, the pitch dimension 700 of the socket connector assembly 102 is approximately 1.0 millimeter or less. Alternatively, the pitch dimension 700 may be smaller, such as 0.8 millimeters or less.

The post 500 is loaded into the hole 420 (shown in FIG. 8) in the substrate 110 through the mating side 402 of the substrate 110. The post 500 is lowered into the hole 420 until the shoulder 516 (shown in FIG. 8) of the post 500 engages the mating side 402. As shown in FIG. 8, the ribs 514 may cut into or displace part of the substrate 110 inside the hole 420 to secure the post 500 in the hole 420. For example, the ribs 514 may project sufficiently far from the body 502 of the post 500 that the dimension of the body 502 across or including the ribs 514 exceeds the inside diameter dimension 800 of the hole 420. By way of example only, the inside diameter dimension 800 of the hole 420 and the outer diameter dimension 604 of the post 500 may be approximately 0.35 millimeters. The radially protruding ribs 514 extend beyond the outer diameter dimension 604 such that the ribs 514 engage the substrate 110 within the hole 420 and secure the post 500 therein.

In the illustrated embodiment, the head portion 512 (shown in FIG. 8) of the post 500 protrudes above the mating side 402. The terminal 112 (shown in FIG. 1) may be electrically coupled to the head portion 512 outside of the hole 420. For example, the terminal 112 may be electrically joined with the upper end 504 of the post 500. Alternatively, the head portion 512 may be sufficiently small to enable the head portion 512 to be received into the hole 420. In such an embodiment, the post 500 may be loaded into the hole 420 until the upper end 504 is flush with the mating side 402 or is recessed within the hole 420 below the mating side 402. Alternatively, the head portion 512 may still protrude from the mating side 402.

The lower end 506 (shown in FIG. 8) of the post 500 is approximately flush with the mounting side 404 (shown in FIG. 8) of the substrate 110. Alternatively, the lower end 506 may protrude from the mounting side 404 or be recessed within the hole 420 such that the lower end 506 does not protrude from the hole 420. The solder 300 (shown in FIG. 8) that is joined with the mounting side 404 about or on the hole 420 at the mounting side 404 also may be coupled with the lower end 506 such that the solder 300 secures the post 500 in the hole 420. As described above, the solder 300 may be reflowed to electrically couple the post 500 with a conductive pad 118 (shown in FIG. 1) on the circuit board 104 (shown in FIG. 1).

Once the post 500 is loaded into the hole 420, the post 500 provides a conductive pathway from the mating side 402 to the mounting side 404 of the substrate 110. As described above, the post 500 may provide this conductive pathway as a single, unitary body 502. For example, while the post 500 may be a solid body 502 that has an exterior coating or plating of another conductive material, the body 502 and plating may together be considered a unitary body 502 as the plating may be bonded or fixed to the body 502 such that the body 502 may not move or be displaced separate from or relative to the plating, and vice-versa.

The solid body 502 of the post 500 may enable the post 500 to be used as the conductive pathway between the mating and mounting sides 402, 404 for holes 420 with relatively large aspect ratios. For example, an aspect ratio of the hole 420 is defined as the thickness dimension 406 of the substrate 110 divided by the inside diameter dimension 800 of the hole 420. If the aspect ratio is too large such that a conductive plating may not be reliably applied to the substrate 110 inside the hole 420 from the mating side 402 to the mounting side 404 in order to create a conductive via through the substrate 110, then the post 500 may be inserted into the hole 420 to provide a conductive pathway through the substrate 110. The post 500 may be formed prior to punching or drilling the hole 420 into the substrate 110 so that the post 500 may be inserted into the hole 420 rather than attempting to plate the substrate 110 inside the hole 420. The post 500 may be used to provide conductive pathways in holes 420 extending through substrates 110 that have aspect ratios that are too large to be reliably plated.

After the posts 500 are loaded into the holes 420, a potting compound (not shown) may be applied to the mating side 402 of the substrate 110 around the posts 500 to seal the mating side 402. For example, a potting compound may be applied to seal interfaces between the posts 500 and the substrate 110 to restrict passage of moisture and other contaminants into the holes 420. Solder (not shown) may then be applied to the upper ends 504 (shown in FIG. 8) of the posts 500 followed by attaching the terminals 112 (shown in FIG. 1) to the upper ends 504. The solder may be reflowed to mechanically and electrically couple the terminals 112 to the posts 500. The terminals 112 may initially be coupled with one another by a terminal carrier (not shown). The carrier may be removed by selective etching of the carrier, for example. The solder 300 (shown in FIG. 3) may be applied to the lower ends 506 of the posts 500 and the mounting side 404 of the substrate 110 and then reflowed to electrically and mechanically couple the socket connector assembly 102 to the circuit board 104 (shown in FIG. 1).

Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A socket connector assembly comprising:
   a socket substrate having a mating side and an opposite mounting side with holes extending through the socket substrate;
   terminals disposed above the mating side of the socket substrate and configured to engage conductive pads of a mating substrate of an electronic package;
   conductive posts disposed in the holes, the posts elongated between upper and lower ends, the upper ends electrically coupled with the terminals, the lower ends configured to be electrically joined with a circuit board, the posts including radially protruding ribs that secure the posts in the socket substrate by engaging the socket substrate inside the holes, wherein the posts electrically couple the electronic package with the circuit board by providing conductive pathways through the socket substrate between the mating side and the mounting side of the socket substrate.

2. The socket connector assembly of claim 1, wherein the posts are solid bodies of conductive material that are formed prior to loading the posts into the holes.

3. The socket connector assembly of claim 1, wherein the posts are secured in the holes of the socket substrate when the lower ends of the posts are bonded to solder disposed on the mounting side of the socket substrate.

4. The socket connector assembly of claim 1, wherein the holes in the socket substrate are not plated with a conductive material.

5. The socket connector assembly of claim 1, wherein the upper ends of the posts protrude from the mating side of the socket substrate.

6. The socket connector assembly of claim 1, wherein the posts include head portions extending from the upper ends to shoulders located between the upper and lower ends of the posts, the head portions protruding above the mating side of the socket substrate with the shoulders abutting the mating side, wherein the head portions are different than the terminals and the terminals are conductively coupled with the head portions.

7. The socket connector assembly of claim 1, wherein the lower ends of the posts are flush with the mounting side of the socket substrate.

8. The socket connector assembly of claim 1, wherein the posts comprise cylindrical bodies.

9. The socket connector assembly of claim 1, wherein the posts include head portions extending from the upper ends toward the lower ends, the head portions having greater outside diameter dimensions that outside diameter dimensions of the posts from the head portions to the lower ends, wherein the head portions are different than the terminals and the terminals are conductively coupled with the head portions.

10. The socket connector assembly of claim 1, wherein the socket substrate extends between a first set of opposite edges and a second set of opposite edges that intersect the first set of opposite edges, the socket substrate including at least 1,500 of the holes and the posts within a boundary defined by the first and second sets of edges.

11. The socket connector assembly of claim 10, wherein the socket substrate has a surface area of 1600 square millimeters or less.

12. The socket connector assembly of claim 1, wherein a pitch distance between adjacent ones of the posts in the socket substrate is 0.8 millimeters or less.

13. The socket connector assembly of claim 1, wherein the ribs and the posts are elongated along a common direction.

14. A socket connector assembly comprising:
   a socket substrate having a thickness extending from a mating side to an opposite mounting side with holes extending through the socket substrate;
   terminals disposed outside of the thickness of the socket substrate and above the mating side of the socket substrate and configured to engage conductive pads of an electronic package;
   posts loaded into the holes, the posts including solid bodies of conductive material that are separate from the terminals and extend between upper ends and opposite lower ends, the upper ends electrically joined with the terminals, the lower ends configured to be electrically joined with a circuit board, wherein the posts provide conductive pathways extending through the socket substrate; and the posts including radially protruding ribs that secure the posts in the socket substrate by engaging the socket substrate inside the holes from the terminals to the mounting side of the socket substrate.

15. The socket connector assembly of claim 14, wherein the upper ends of the posts are disposed in locations that are proximate to the mating side of the socket substrate and the lower ends are disposed in locations that are located proximate to the mounting side of the socket substrate.

16. The socket connector assembly of claim 14, wherein the posts are formed prior to loading the posts into the holes of the socket substrate.

17. The socket connector assembly of claim 14, wherein the posts are secured in the holes of the socket substrate when the lower ends of the posts are bonded to solder disposed on the mounting side of the socket substrate.

18. The socket connector assembly of claim 14, wherein the holes in the socket substrate are not plated with a conductive material.

19. The socket connector assembly of claim 14, wherein the bodies of the posts have cylindrical shapes.

20. The socket connector assembly of claim 14, wherein the socket substrate extends between a first set of opposite edges and a second set of opposite edges that intersect the first set of opposite edges, the socket substrate including at least 2,000 of the holes and the posts within a boundary defined by the first and second sets of edges.

* * * * *